United States Patent [19]

Ghafghaichi et al.

[11] Patent Number: 5,834,323
[45] Date of Patent: Nov. 10, 1998

[54] METHOD OF MODIFICATION AND TESTING FLIP-CHIPS

[75] Inventors: Majid Ghafghaichi, Saratoga; A. Regina Campbell, Livermore, both of Calif.

[73] Assignee: Accurel Systems International Corporation, Sunnyvale, Calif.

[21] Appl. No.: 785,546

[22] Filed: Jan. 21, 1997

[51] Int. Cl.$^6$ ........................................... H01L 21/66
[52] U.S. Cl. ........................... 438/17; 438/14; 438/118
[58] Field of Search ........................... 438/14, 15, 16, 438/17, 18, 108, 118

[56] References Cited

U.S. PATENT DOCUMENTS

| | | | |
|---|---|---|---|
| 3,984,860 | 10/1976 | Logue | 438/15 |
| 5,153,507 | 10/1992 | Fong | 638/15 |
| 5,220,280 | 6/1993 | Visel et al. | 438/15 |
| 5,262,355 | 11/1993 | Nishiguchi et al. | 438/15 |
| 5,289,631 | 3/1994 | Koopman et al. | 438/15 |
| 5,444,388 | 8/1995 | Ideta et al. | 438/15 |

*Primary Examiner*—Kevin Picardat
*Attorney, Agent, or Firm*—Burns, Doane, Swecker & Mathis, L.L.P.

[57] ABSTRACT

A method for inspecting and testing IC flip-chips without removing the chips from their packages includes providing at least three alignment holes on a substrate surface of the chip opposite its circuit-patterned face. The alignment indicia are positioned in a predetermined relationship to the circuit pattern, and provide marks for aligning a mirror image of a circuit pattern of the circuit-patterned face as an overlay on the substrate side. The substrate can be thinned in a region corresponding to the circuit pattern to enhance the accessibility of the circuit-patterned side via the substrate.

15 Claims, 2 Drawing Sheets

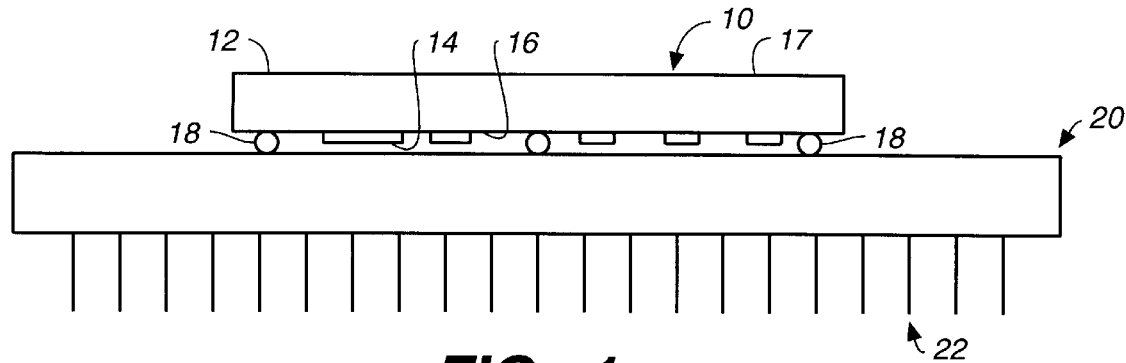
FIG._1
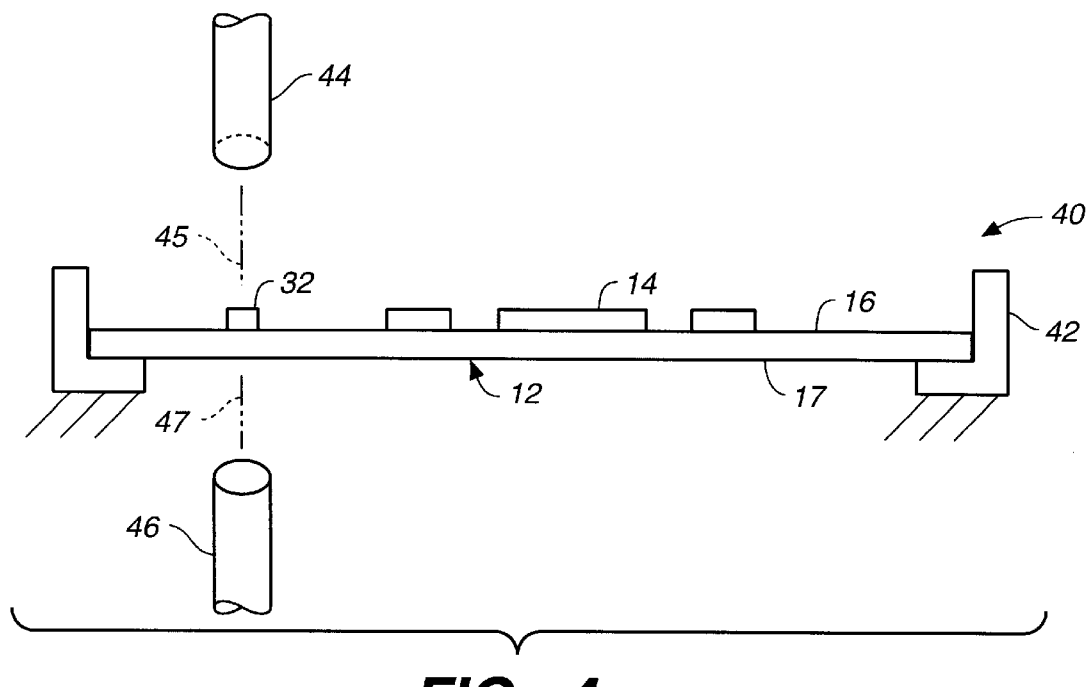
FIG._4
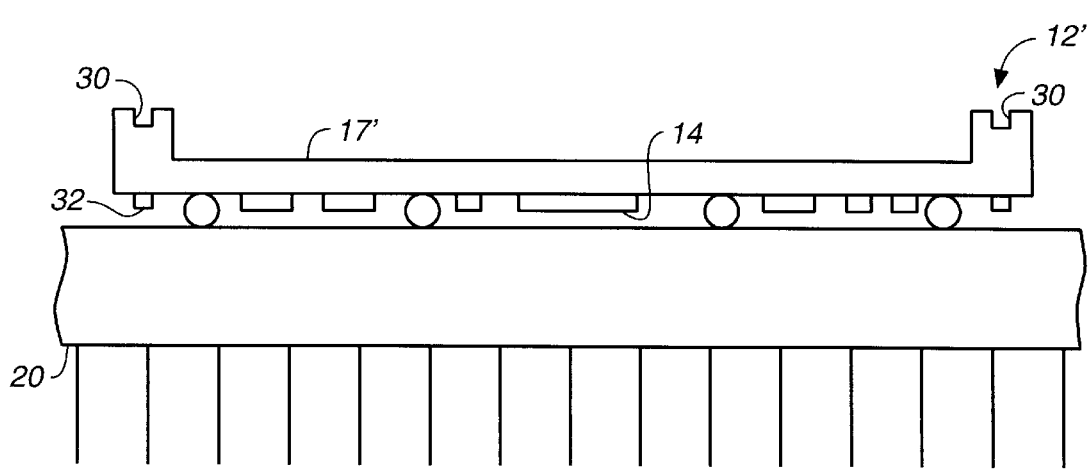
FIG._5

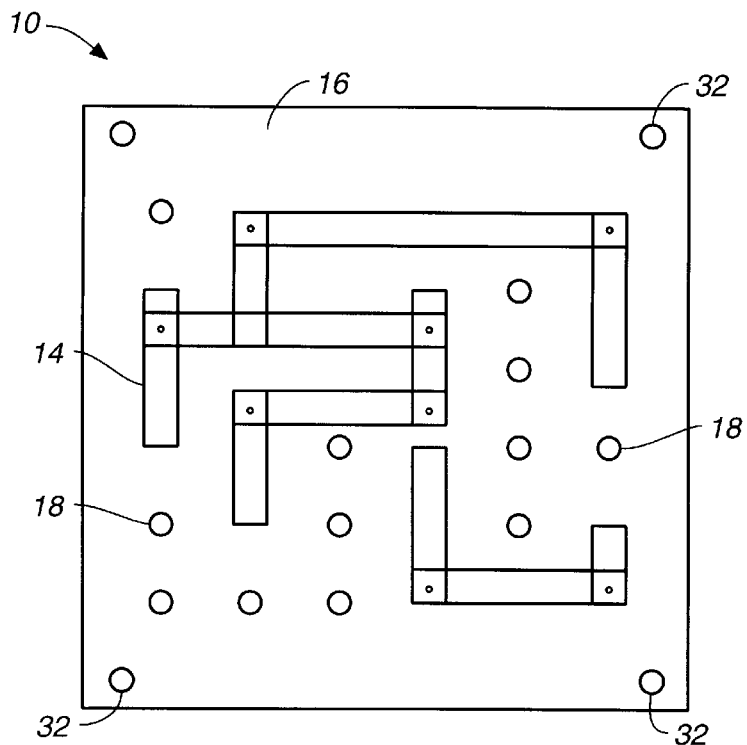
FIG._2
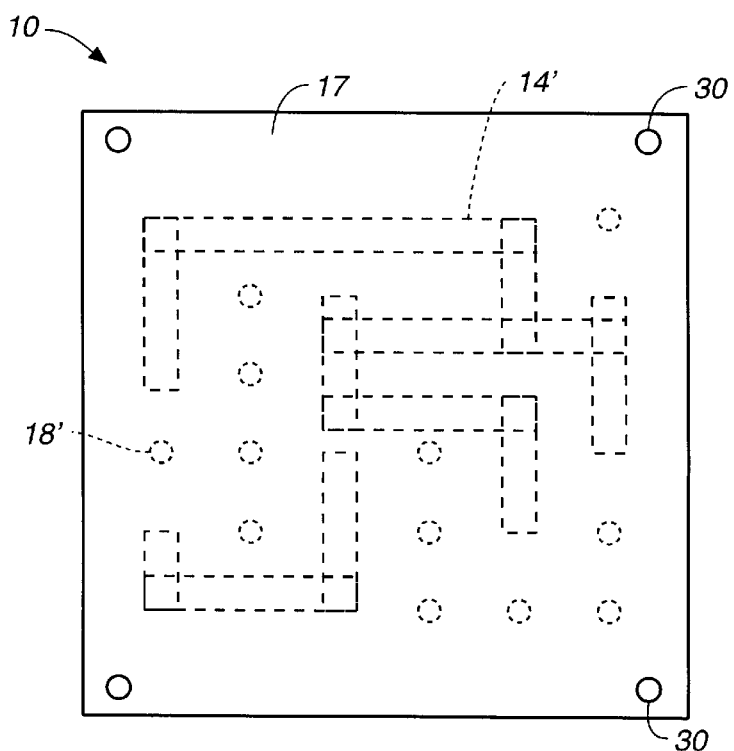
FIG._3

METHOD OF MODIFICATION AND TESTING FLIP-CHIPS

BACKGROUND OF THE INVENTION

1. Field of the Invention

The present invention generally relates to technology for inspecting and repairing silicon integrated circuit (IC) chips and, more particularly, to methods for inspecting and testing IC chips without removing the chips from their packages.

2. State of the Art

In the manufacturing and packaging of silicon integrated circuits, flip-chip technology is enjoying increasingly wider use. To form an IC flip-chip, an IC chip is mounted in a package with the chip's circuit pattern facing down; in other words, the IC chip is "flipped over" in its package as compared to conventional orientations. In this inverted attitude, the bottom face of the silicon substrate of the IC chip faces away from the package. In usual practice, the flip-chip is attached to the package with solder bumps that electrically connect the circuitry in the chip to the package. The package supports the flip-chip and provides leads for connecting its circuitry to a circuit board or other devices.

Because the circuit side of a packaged flip-chip is positioned facing the interior of its package, the IC circuit is not readily accessible for testing, editing, modification and similar operations that require direct probing of the IC itself. If a technician wants to probe the circuitry of a flip-chip, as for purposes of performing failure analysis, the technician cannot use conventional methods to access the IC circuitry. On the other hand, removal of a flip-chip from its package destroys the functionality of the package and may destroy the chip itself. Moreover, after removal, a flip-chip cannot be re-attached to its package in working order. Thus, removal of a flip-chip from its package is not a viable option if continued use of the chip is desired.

SUMMARY OF THE INVENTION

The present invention provides a method for accurately accessing the circuitry of a IC flip-chip while the chip remains mounted in its package. The present invention, therefore, permits a technician to probe, edit, analyze, or perform similar operations on the circuitry within a flip-chip without removal from its package and, thus, without destroying the operability of the chip.

The method of the present invention includes the steps of providing at least three alignment indicia on the surface of the flip-chip substrate opposite the circuit-patterned face with the alignment indicia being positioned in a predetermined relationship to the circuit pattern. Then, a mirror image of the circuit-patterned face is formed, including indication of the alignment indicia positions. This allows aligning the alignment indicia in the mirror image circuit pattern with the alignment indicia on the substrate to overlay the mirror image of the circuit pattern on the substrate. Thus, by this method, the circuitry of the flip chip can be accurately ascertained on the substrate face of the chip, and operations on the circuitry can be performed via the substrate side.

In practice, the alignment indicia can be formed by any convenient method. For example, the alignment indicia can be formed by printed marks on the substrate surface or another suitable marking method.

In one preferred embodiment of the present invention, the substrate is thinned, that is, material is removed from at least a region corresponding to the circuit pattern so that a thickness of the IC chip is reduced sufficiently for access to the circuitry side. In practice, the IC chip is thinned to within a range of about 5 to 10 microns and, more preferably, to about ten (10) microns.

Preferably, the alignment indicia are formed as holes in the substrate. The alignment holes can be closed-end or recesses. Alternatively, the holes can be formed to pass entirely through the substrate. In practice, the step of providing the at least three alignment indicia includes the steps of aligning an indicia forming device with an alignment light, positioning a IC chip between the indicia forming device and the alignment light with the substrate surface facing the indicia forming device, aligning a circuit pattern mark on the circuit-patterned side with the alignment light, and forming the alignment indicia with the indicia forming device. The indicia forming device can conveniently be a laser which can provide very precisely located and sized holes. Alternatively, a mechanical drilling device can be used. Other suitable means, such as etching holes in the substrate surface, can also be used.

Preferably, the alignment indicia are formed when the circuit-patterned side is still accessible, which is to say, before the chip is packaged. For handling convenience, it is preferred to form the alignment indicia on a semiconductor wafer before it is diced into individual chips. Thus only a single large item (i.e, the wafer) need be handled rather than a large number of individual IC chips.

To accurately locate the aligning indicia, the circuitry side can conveniently include marks, which can be printed or formed along with the circuit pattern, to serve as alignment marks for locating the aligning indicia.

According to another aspect of the present invention, the step of providing a mirror image of the chip circuit pattern is performed by a computer-based system, for example, the Knights Technology Stage Navigator system, which has the capability to take an image of a circuit pattern, form a mirror image therefrom, and overlay the mirror image on a work surface, that non-patterned substrate side. The corresponding location on the substrate side for any location in the circuit pattern can be accurately ascertained with such a system.

BRIEF DESCRIPTION OF THE DRAWINGS

The present invention will be more fully understood by reference to the following description in conjunction with the appended drawings, which are not drawn to scale, but are simplified representations of IC flip-chips and related structure for the purpose of facilitating a description of the present invention. In the drawings:

FIG. 1 is an illustration of a flip-chip mounted on an integrated circuit package;

FIG. 2 is a view of a circuit-patterned side of a flip-chip showing the layers of metal circuitry and solder bumps for mounting the flip-chip to a package;

FIG. 3 is a view of the flip-chip of FIG. 2 from the substrate side:

FIG. 4 is a schematic view of an apparatus for applying alignment indicia to the flip-chip of FIGS. 1—3; and, FIG. 5 is a side elevation of a flip-chip that has been prepared in accordance with the method of the present invention for testing, modification or other operation.

DETAILED DESCRIPTION OF THE PRESENT INVENTION

As shown in FIG. 1, a flip-chip 10 is mounted on an integrated circuit flip-chip package 20. The flip-chip 10 includes a substrate 12 on which is formed the metal circuit pattern 14 on one side (herein the circuit-patterned side) 16 of the substrate. The other side (herein the substrate side) 17 is opposite the circuit-patterned side 16. (In FIG. 2, the metal layers 14 are indicated by bars.)

The package 20 structurally supports the flip-chip 10 and provides means for connecting it to a larger circuit. Typically, solder bumps 18 on the circuit-patterned side 16 attach the flip-chip 10 to the package 20 and serve to electrically connect the metal layer pattern 14 of the chip to the package 20. (In FIG. 2, the solder bumps 18 are indicated by circles.) The package 20 includes extending leads 22 for connecting the flip-chip to a circuit board or the like.

It should be noted that, as shown in FIG. 1, the circuit-patterned side 16 of the flip-chip 10 faces the interior of the package 20 and, for that reason, is not directly accessible.

FIG. 3 shows a circuit pattern 14' and solder bumps 18' which are a mirror image of the circuit pattern and solder bumps as they appear viewed directly on circuit-patterned side 16. In other words, FIG. 3 shows a circuit pattern which is the mirror image of FIG. 2. When the mirror image of the circuit-patterned side 16 is projected onto the substrate side 17, a technician can precisely align the mirror image circuit pattern 14' to precisely correspond to the actual circuit pattern 14 on the circuit-patterned side 16. Then, by viewing the mirror image projected onto the substrate side, a technician can access accurately the circuitry 14 via the substrate side 17.

According to the present invention, alignment indicia 30 are provided on the substrate side 17 of the flip-chip for guiding the placement of the mirror image pattern 14'. The alignment indicia 30 are precisely located relative to the circuit pattern 14 so that, by reference to the alignment indicia 30, the mirror image pattern 14' can be accurately positioned and aligned on the substrate side to correspond with the actual pattern 14. Preferably, at least three alignment marks 32 are placed on the circuit-patterned side 16 in a predetermined spacial relationship with the circuit pattern 14. The alignment marks are used to compensate for irregularities in the solder bump height, which could cause the chip 10 to deviate from being parallel with the flip-chip package 20. The alignment marks 32 can be placed on the circuit-patterned side 16 by various convenient methods, such as deposition or printing.

Referring now to FIG. 4, an example of a system 40 for providing alignment indicia 30 on the substrate side 17 includes a locating light 44, an indicia forming device 46, and a support 42 for holding the flip-chip 12. The locating light 44 can be, for example, an optical microscope. The locating light 44 and the indicia forming device 46 are positioned in axial alignment so that the sight axis 45 of the locating light 44 and an operating axis 47 of the indicia forming device 46 are on a single line. After the locating light 44 and indicia forming device 46 are aligned, a flip-chip 12 can be positioned between the light and indicia forming device with its circuitry side 16 facing the locating light. An alignment mark 32 is positioned in the beam 45 of the locating light 44. Then, the indicia forming device 46 is activated to form an indicia 30 on the substrate side 17 of the chip 12, which then is in precise alignment with the alignment mark 30, and thus, in known relationship to the circuit pattern 14. The step of forming the alignment indicia is repeated using the other alignment marks 32 so that at least three alignment indicia are formed for the chip.

Preferably, the indicia forming device 46 is a laser capable of ablating a hole in the substrate side 17. The ablated hole can be formed to pass entirely through the substrate 12 to the circuit-patterned side 16. The hole need be formed only a few microns deep, which is sufficient for locating the hole for later use. Other suitable indicia-forming means can be employed, for example, a mechanical drill, FIB, or etching. The step of forming the alignment indicia on the substrate side 17 is accomplished before the chip is attached to the flip-chip package 20 and, most conveniently, is done when the chip 12 is still a part of a wafer (that is, before a wafer is diced into individual chips).

FIG. 5 shows a flip-chip package having alignment indicia formed such that the chip is prepared for testing, editing, or other operations. Preferably, the substrate surface 17 is thinned to allow access through the substrate side 17 to the circuit-patterned side 16. In practice, thinning in the range of 5 to 10 microns is suitable. The substrate 12 is thinned by first positioning the chip through use of the alignment indicia 32 so that an appropriate area of the chip can be identified for thinning. This area preferably corresponds to the area on the circuit-patterned side 16 actually bearing the circuit pattern 14. Thinning can be done by various methods, the most precise being laser ablation. Other methods such as mechanical removal of material and etching may be used. Preferably, the step of forming the alignment indicia on the substrate side 17 is accomplished before any thinning of the chip substrate, thereby minimizing handling and manipulation of the chips.

The prepared chip 12' can have the mirror image 14' of the circuit pattern 14 overlaid on the substrate side 17' in precise registration with the alignment holes 32. One system for creating a mirror image of the circuit pattern, and for manipulating the mirror image to navigate the substrate side to a desired location, is the Stage Navigator system which is available from Knights Technology Corporation of Sunnyvale, Calif.

By using the above-described alignment holes 32 and the mirror image system, the prepared chip 12' can be drilled with FIB or a laser to access any predetermined location on the circuitry 14. Then, the drilled chip 12' can be probed, edited, analyzed for failure, or other operations, without removal from the flip-chip package. Accordingly, after such operations, a flip-chip will remain fully functional without destruction of the functionality of the flip-chip package or the chip itself.

While the present invention has been illustrated and described in accordance with a preferred embodiment, it should be recognized that variations and changes may be made therein without departing from the invention as set forth in the following claims.

What is claimed is:

1. A method of aligning an integrated circuit flip-chip for testing and modification without removing the flip-chip from its package comprising the steps of:

providing at least three alignment indicia on a substrate surface of a IC chip, which substrate surface is opposite the circuit-patterned face, positioning the at least three alignment indicia in a precise, spacial relationship to the circuit pattern;

establishing a mirror image of a circuit pattern of the circuit-patterned face including the alignment indicia positions; and aligning the alignment indicia in the mirror image circuit pattern with the alignment indicia on the substrate to position the mirror image of the circuit pattern on the substrate, with the mirror image is overlaid on the substrate surface in precise alignment with the circuit pattern on the circuit pattern face.

2. The method of claim 1, further comprising the step of thinning the substrate side at least in a region corresponding to the circuit pattern so that a thickness of the IC chip is reduced sufficiently for access to the circuit pattern side.

3. The method of claim 1, wherein the step of providing the alignment indicia includes forming holes in the substrate surface.

4. The method of claim 3, wherein the holes are formed as shallow recesses in the substrate surface.

5. The method of claim 1, wherein the step of providing the alignment indicia includes the steps of printing marks on the substrate surface.

6. The method of claim 1, wherein the step of providing the alignment indicia is accomplished by the steps of: aligning an indicia forming device with an alignment light; positioning a IC chip between the indicia forming device and the alignment light with the substrate surface facing the indicia forming device; aligning a alignment mark on the circuit-patterned side with the alignment light; and forming the alignment indicia with the indicia forming device to correspond with the alignment mark on the circuit pattern face.

7. The method of claim 6, wherein the indicia forming device is a laser and the alignment indicia are formed as holes in the substrate of the IC chip.

8. The method of claim 6, wherein the indicia forming device is a drill, and the alignment indicia are formed as holes in the IC chip.

9. The method of claim 6, wherein the indicia forming device forms holes for the alignment indicia by etching holes in the substrate surface.

10. The method of claim 6, wherein the indicia forming device prints marks on the substrate surface for the alignment indicia.

11. The method of claim 1, wherein the step of providing alignment indicia is performed before a semiconductor wafer is diced into a plurality of individual IC chips.

12. The method of claim 2, wherein the chip is thinned to a thickness of about ten (10) microns.

13. The method of claim 2, wherein the step of thinning the substrate is performed by laser removal of substrate material.

14. The method of claim 2, wherein the step of thinning the substrate is by etching.

15. The method of claim 2, wherein the step of thinning the substrate is accomplished by mechanical removal of the material.

* * * * *

UNITED STATES PATENT AND TRADEMARK OFFICE
CERTIFICATE OF CORRECTION

PATENT NO. : 5,834,323

DATED : 11/10/98

INVENTOR(S) : Ghafghaichi et al.

It is certified that error appears in the above-identified patent and that said Letters Patent is hereby corrected as shown below:

Column 3, line 62, delete "30" and insert --32--.

Column 4, line 17, delete "32" and insert --30--.

Column 4, line 36, delete "32" and insert --30--.

Signed and Sealed this

Sixth Day of April, 1999

Attest:

Q. TODD DICKINSON

Attesting Officer

Acting Commissioner of Patents and Trademarks